United States Patent
Mochiki et al.

(10) Patent No.: US 10,050,512 B2
(45) Date of Patent: Aug. 14, 2018

(54) POWER CONVERSION APPARATUS

(71) Applicant: DENSO CORPORATION, Kariya, Aichi-pref. (JP)

(72) Inventors: Kengo Mochiki, Kariya (JP); Mitsunori Kimura, Kariya (JP); Hiroshi Shimizu, Kariya (JP); Yasuyuki Ohkouchi, Kariya (JP); Yuu Yamahira, Kariya (JP); Tetsuya Matsuoka, Kariya (JP); Kazuma Fukushima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/491,366

(22) Filed: Apr. 19, 2017

(65) Prior Publication Data
US 2017/0302153 A1    Oct. 19, 2017

(30) Foreign Application Priority Data

Apr. 19, 2016  (JP) ................. 2016-083937

(51) Int. Cl.
| | |
|---|---|
| *H02M 1/088* | (2006.01) |
| *H01L 27/06* | (2006.01) |
| *H02M 3/158* | (2006.01) |
| *H02M 7/537* | (2006.01) |
| *H03K 17/081* | (2006.01) |

(Continued)

(52) U.S. Cl.
CPC ........ *H02M 1/088* (2013.01); *H01L 27/0623* (2013.01); *H02M 3/158* (2013.01); *H02M 7/537* (2013.01); *H03K 17/0412* (2013.01); *H03K 17/08116* (2013.01); *H03K 17/6871* (2013.01);

(Continued)

(58) Field of Classification Search
CPC ......... H02M 3/33569; H02M 3/33592; H02M 3/3376; H02M 3/337; H02M 3/33507; H02M 3/33523; H02M 7/5387; H02M 7/003; H02M 7/538; H02M 7/53806; H02M 7/53871; H02M 7/53875; H02M 7/537; H02M 2001/0032; H02M 3/158;

(Continued)

(56) References Cited

U.S. PATENT DOCUMENTS

| | | | |
|---|---|---|---|
| 2012/0057387 A1* | 3/2012 | Lai ................... | H02M 7/797 363/132 |
| 2012/0300418 A1* | 11/2012 | Nakamura ......... | H01L 23/5286 361/748 |
| 2013/0155745 A1 | 6/2013 | Tanaka et al. | |

* cited by examiner

*Primary Examiner* — Kyle J Moody
*Assistant Examiner* — Kevin H Sprenger
(74) *Attorney, Agent, or Firm* — Oliff PLC

(57) ABSTRACT

A power conversion apparatus includes a semiconductor module including a semiconductor device and a control circuit unit controlling the semiconductor module. The semiconductor module has main and subsidiary semiconductor devices connected in parallel. The control circuit unit performs control such that the subsidiary semiconductor device is turned on after the main semiconductor device is turned on, and the main semiconductor device is turned off after the subsidiary semiconductor device is turned off. The control circuit unit performs control such that, one of the turn-on and turn-off switching timings has a switching speed faster than that of the other of the switching timings. The semiconductor module is configured such that, at a high-speed switching timing, an induction current directed to turn off the subsidiary semiconductor device is generated in a control terminal of the subsidiary semiconductor device depending on temporal change of a main current flowing to the main semiconductor device.

8 Claims, 16 Drawing Sheets

(51) Int. Cl.
*H03K 17/0412* (2006.01)
*H03K 17/687* (2006.01)
*H02P 27/06* (2006.01)
*H03K 17/12* (2006.01)

(52) U.S. Cl.
CPC ............ *H02P 27/06* (2013.01); *H03K 17/127* (2013.01); *H03K 2217/0036* (2013.01)

(58) Field of Classification Search
CPC .. H02M 1/088; Y02B 70/1433; Y02B 70/126; Y02B 70/1475; Y02B 70/1441
USPC ..... 363/16, 17, 56.02, 97, 98, 131, 132, 147
See application file for complete search history.

POWER CONVERSION APPARATUS

CROSS-REFERENCE TO RELATED APPLICATION

This application is based on and claims the benefit of priority from earlier Japanese Patent Application No. 2016-83937 filed Apr. 19, 2016, the description of which is incorporated herein by reference.

BACKGROUND

Technical Field

The present invention relates to a power converter having a semiconductor module including a semiconductor device and a control circuit unit that controls switching operation of the semiconductor module.

Related Art

There is known a power conversion apparatus including a semiconductor module including a semiconductor device and a control circuit unit connected to the semiconductor module (refer to JP 580513 B1). In this power conversion apparatus, switching operation of the semiconductor device is performed by the control circuit unit. As a result, power conversion is performed.

In recent years, a technique of connecting a semiconductor device serving as a main device (main semiconductor device) and a semiconductor device serving as a subsidiary device (subsidiary semiconductor device) in parallel to switch the semiconductor devices has been reviewed. In addition, a technique of, for example, using an IGBT as the main semiconductor device and using a MOSFET as a subsidiary semiconductor device has been reviewed. In this manner, techniques of improving characteristics of the entire semiconductor module by connecting semiconductor devices having different characteristics in parallel have been reviewed.

However, disadvantageously, an on-state resistance of the MOSFET (subsidiary semiconductor device) easily increases as a temperature increases. For this reason, studies for reducing a switching loss of the subsidiary semiconductor device have been made. For example, a technique of turning on the subsidiary semiconductor device after turning on the main semiconductor device and turning off the main semiconductor device after turning off the subsidiary semiconductor device has been reviewed (refer to FIG. 5). As a result, when a subsidiary switching element is changed from an off-state to an on-state or from an on-state to an off-state, the main semiconductor device is necessarily turned on. For this reason, switching operation of the subsidiary semiconductor device can be performed while the main semiconductor device is turned on, and a voltage across terminals is lowered. Therefore, it is possible to reduce a switching loss of the subsidiary semiconductor device. For this reason, it is possible to suppress a temperature rise of the subsidiary semiconductor device.

However, the switching loss of the subsidiary semiconductor device may not be necessarily sufficiently reduced using the aforementioned power conversion apparatus. That is, if the switching operation of the main semiconductor device is performed, a main current flowing to the main semiconductor device is changed with time. For this reason, a magnetic field generated around the main current is changed with time, so that an induction current may be generated in the control terminal of the subsidiary semiconductor device to turn on the subsidiary semiconductor device. Therefore, the subsidiary semiconductor device may be erroneously turned on at the same time when the main semiconductor device performs switching operation. As a result, it may be difficult to sufficiently reduce a switching loss of the subsidiary semiconductor device.

SUMMARY

An embodiment provides a power conversion apparatus capable of suppressing an erroneous operation of the subsidiary semiconductor device.

As an aspect of the embodiment, a power conversion apparatus includes: a semiconductor module including a semiconductor device; and a control circuit unit that controls switching operation of the semiconductor module. The semiconductor module has a main semiconductor device and a subsidiary semiconductor device connected in parallel to each other as the semiconductor device. The control circuit unit performs control such that the subsidiary semiconductor device is turned on after the main semiconductor device is turned on, and the main semiconductor device is turned off after the subsidiary semiconductor device is turned off. The control circuit unit performs control such that, out of two switching timings including a turn-on timing at which the main semiconductor device is switched from an off-state to an on-state and a turn-off timing at which the main semiconductor device is switched from an on-state to an off-state, one of the switching timings has a switching speed faster than that of the other of the switching timings. The semiconductor module is configured such that, at a high-speed switching timing having a fast switching speed, an induction current directed to turn off the subsidiary semiconductor device is generated in a control terminal of the subsidiary semiconductor device depending on a temporal change of a main current flowing to the main semiconductor device.

BRIEF DESCRIPTION OF THE DRAWINGS

In the accompanying drawings:

FIG. 1 is a cross-sectional view illustrating a semiconductor module according to a first embodiment when a main semiconductor device is turned on;

FIG. 3 is a circuit diagram illustrating the semiconductor module according to the first embodiment when the main semiconductor device is turned on;

FIG. 11 is a cross-sectional view illustrating a semiconductor module according to a second embodiment when a main semiconductor device is turned on;

FIG. 14 is a cross-sectional view illustrating a semiconductor module according to a third embodiment when a main semiconductor device is turned on;

FIG. 16 is a circuit diagram illustrating a part of a semiconductor module according to a fifth embodiment along with a driving circuit when the main semiconductor device is turned on.

DETAILED DESCRIPTION OF THE PREFERRED EMBODIMENTS

The power conversion apparatus may be an in-vehicle power conversion apparatus mounted on a vehicle such as a hybrid vehicle or an electric vehicle.

First Embodiment

Figure 7:
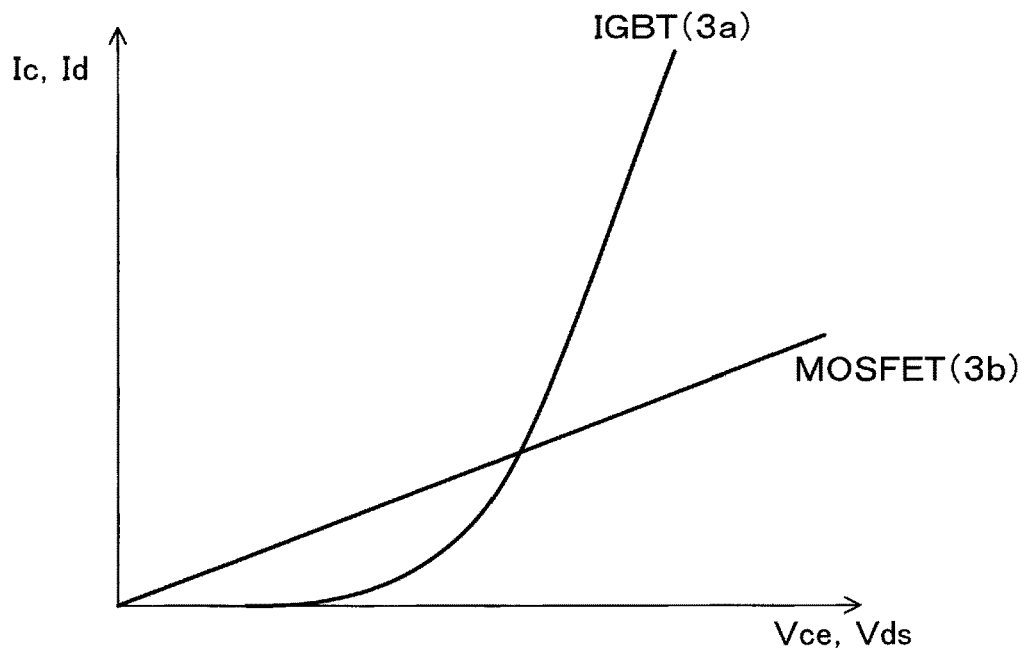
FIG. 7 illustrates current-voltage characteristics of the main semiconductor device and the subsidiary semiconductor device according to the first embodiment at a high temperature.
Figure 8:
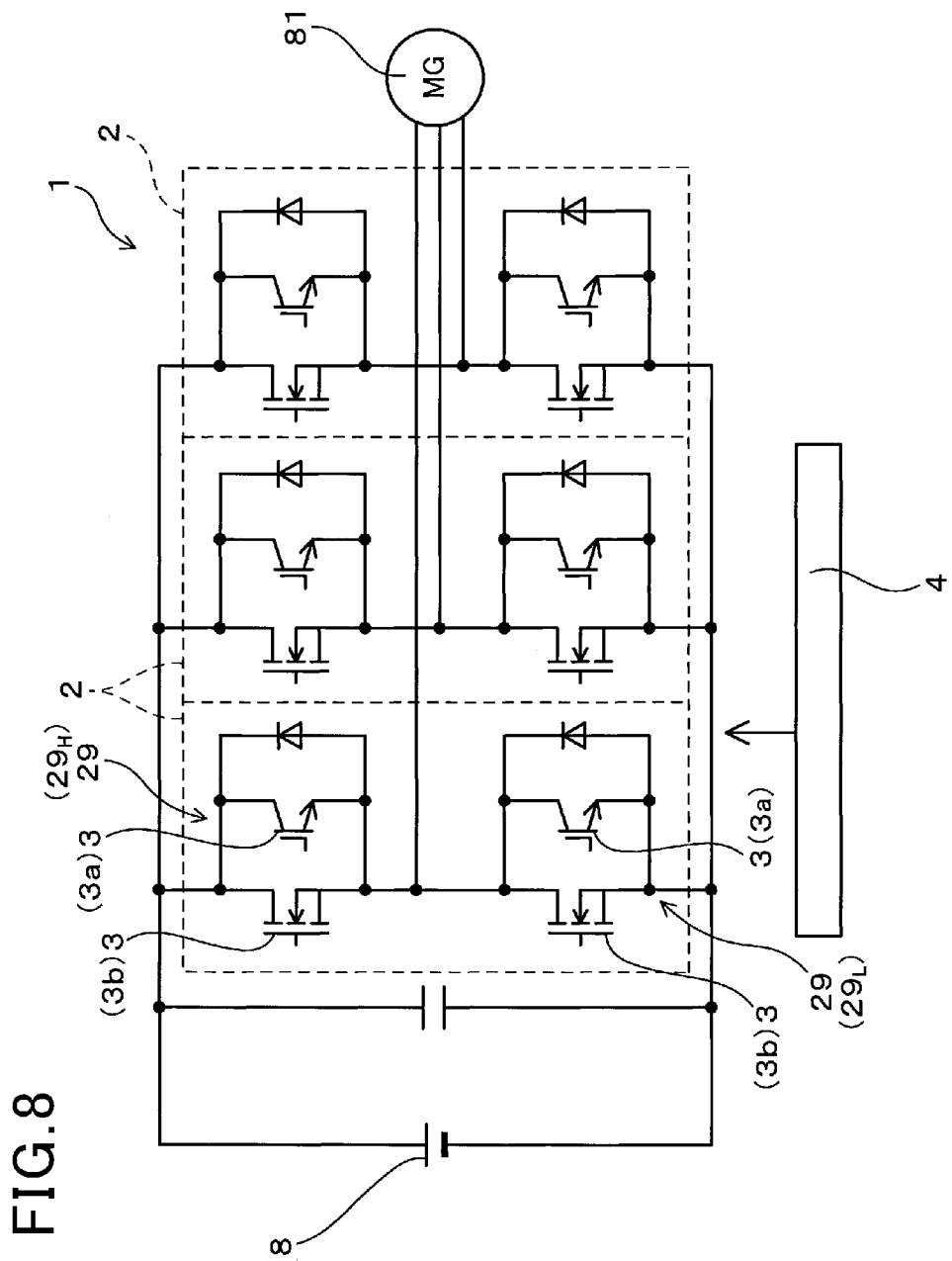
FIG. 8 is a circuit diagram illustrating a power conversion apparatus according to the first embodiment.

A power conversion apparatus according to an embodiment will be described with reference to FIGS. 1 to 10. As illustrated in FIG. 8, the power converter 1 according to this embodiment includes a semiconductor module 2 including a semiconductor device 3 and a control circuit unit 4 that controls switching operation of the semiconductor module 2.

The semiconductor module 2 includes, as semiconductor devices 3, a main semiconductor device 3a and a subsidiary semiconductor device 3b connected in parallel to each other.

Figure 5:
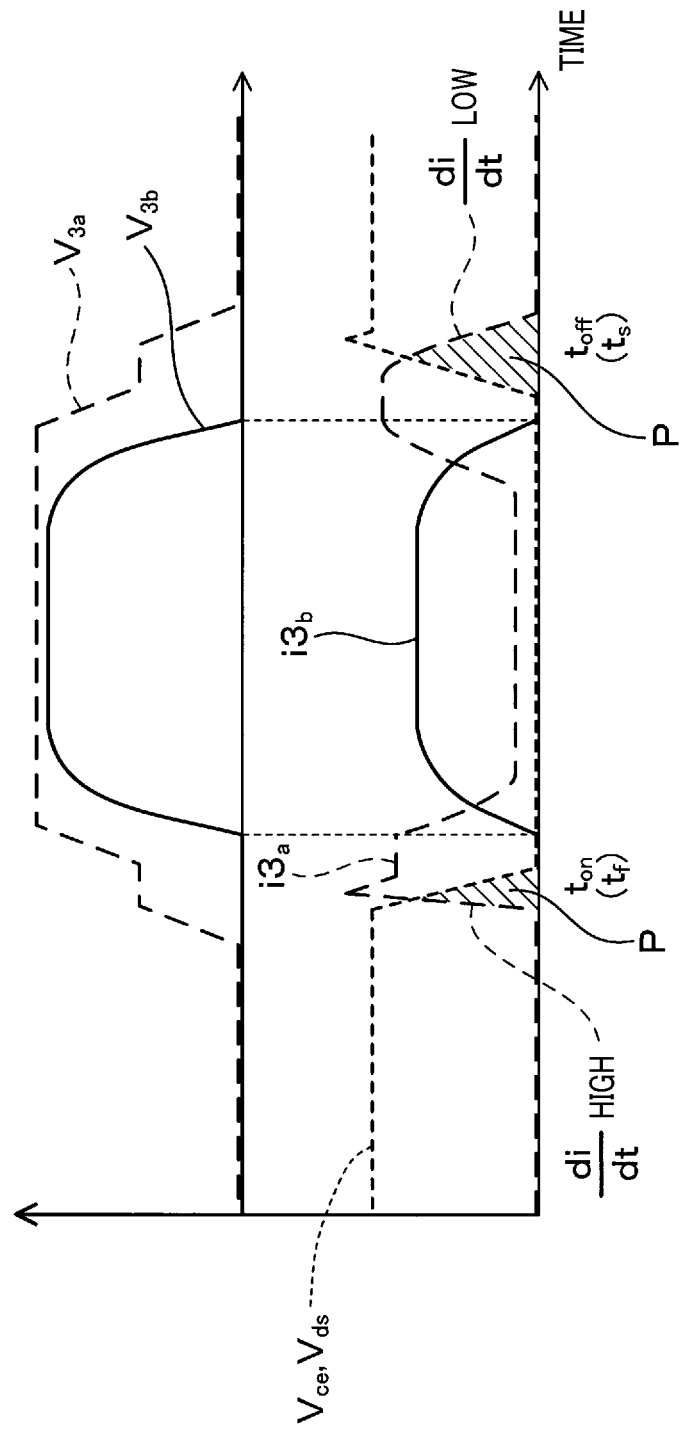
FIG. 5 is a waveform diagram illustrating the main semiconductor device and a subsidiary semiconductor device according to the first embodiment.

As illustrated in FIG. 5, the control circuit unit 4 performs control such that the subsidiary semiconductor device 3b is turned on after the main semiconductor device 3a is turned on, and the main semiconductor device 3a is turned off after the subsidiary semiconductor device 3b is turned off.

As illustrated in FIG. 5, the control circuit unit 4 performs control such that, out of two switching timings including a turn-on timing $t_{on}$ at which the main semiconductor device 3a is switched from an off-state to an on-state and a turn-off timing $t_{off}$ at which the main semiconductor device 3a is switched from an on-state to an off-state, one of the switching timings (in the present embodiment, the turn-on timing $t_{on}$) has a switching speed faster than that of the other of the switching timings (in the present embodiment, the turn-off timing $t_{off}$).

Figure 1:
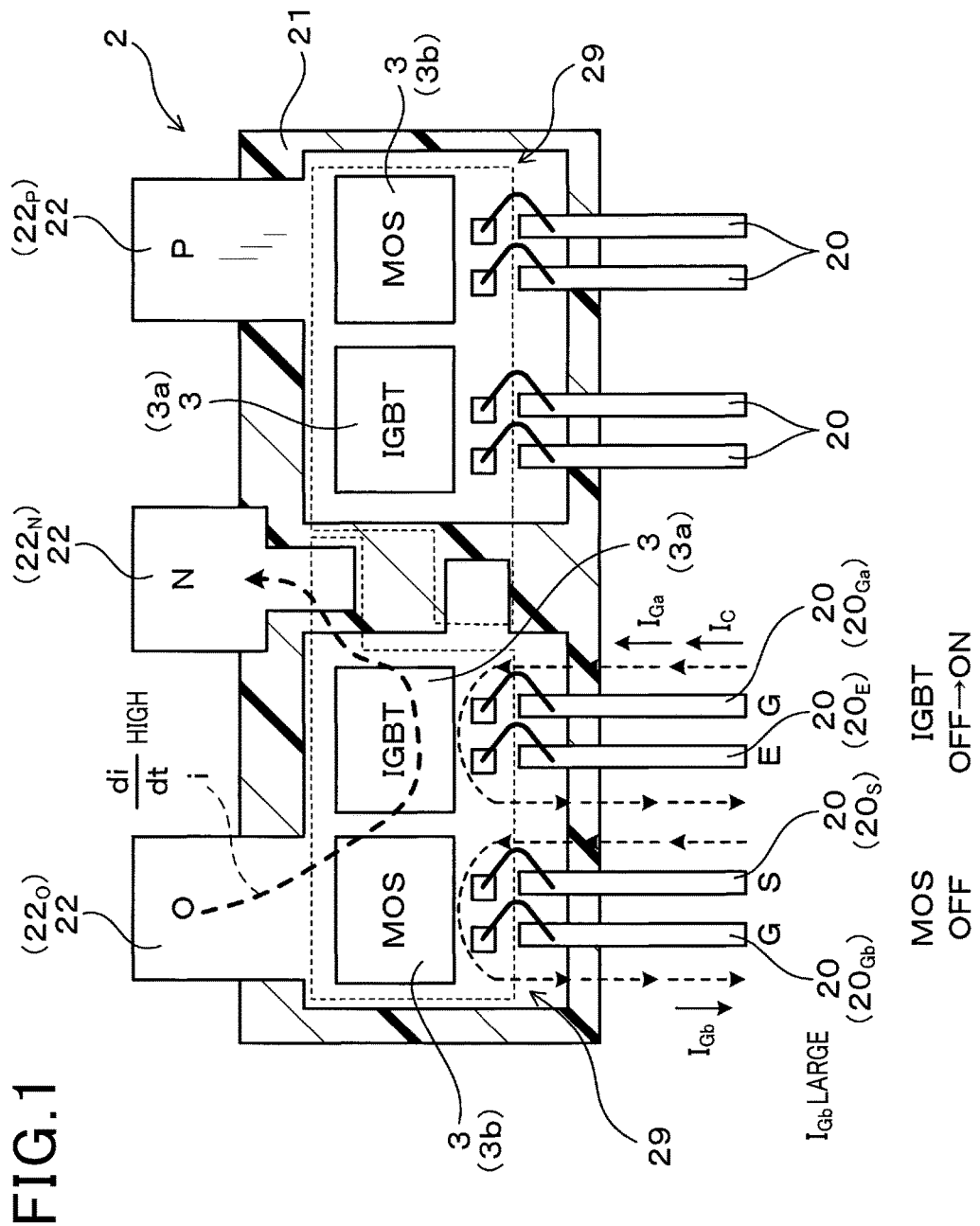

As illustrated in FIG. 1, the semiconductor module 2 according to this embodiment is configured such that, at a high-speed switching timing $t_f$ having a fast switching speed (turn-on timing $t_{on}$), an induction current $I_{Gb}$ directed to turn off the subsidiary semiconductor device 3b is generated in a control terminal 20 of the subsidiary semiconductor device 3b depending on a temporal change (change with time, rate of change) di/dt of a main current i flowing to the main semiconductor device 3a.

The power conversion apparatus 1 according to the present embodiment is an in-vehicle power conversion apparatus mounted on a hybrid vehicle or an electric vehicle. As illustrated in FIG. 8, the power conversion apparatus 1 according to the present embodiment includes a plurality of semiconductor modules 2. Each semiconductor module 2 has two semiconductor device pairs 29 each having the main semiconductor device 3a and the subsidiary semiconductor device 3b. Such semiconductor device pairs 29 are connected in series to each other.

The control circuit unit 4 performs switching operation of the semiconductor device 3 (3a and 3b). As a result, DC power supplied from a DC power source 8 is converted into AC power. In addition, using the obtained AC power, an AC load 81 (three-phase AC motor) is driven. As a result, the vehicle is operated.

The main semiconductor device 3a according to this embodiment is an IGBT. In addition, the subsidiary semiconductor device 3b is a MOSFET. More specifically, the subsidiary semiconductor device 3b is a MOSFET formed of SiC (wide bandgap semiconductor).

Figure 6:
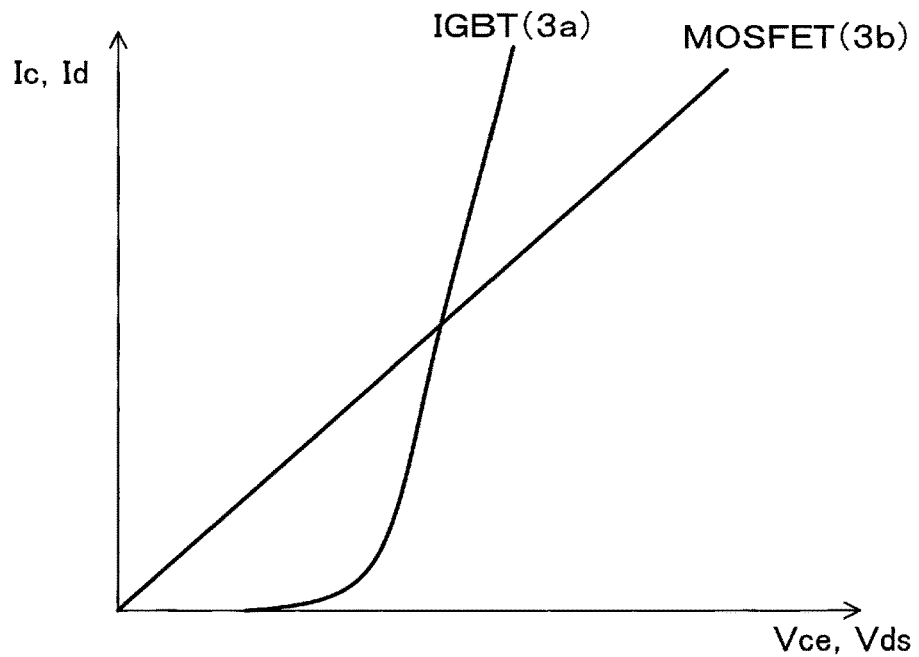
FIG. 6 illustrates current-voltage characteristics of the main semiconductor device and the subsidiary semiconductor device according to the first embodiment at room temperature.

FIG. 6 illustrates current-voltage characteristics of the MOSFET and the IGBT. As illustrated in FIG. 6, the MOSFET has an on-state resistance lower than that of the IGBT when a small electric current flows. For this reason, using the MOSFET, it is possible to lower the on-state resistance in a low current region. In addition, when a large current flows, the IGBT has an on-state resistance lower than that of the MOSFET. For this reason, using the IGBT, it is possible to lower the on-state resistance in a high current region. In this manner, using a combination of the MOSFET and IGBT, it is possible to reduce the on-state resistance of the semiconductor module 2 across a wide current range.

However, the on-state resistance of the MOSFET easily increases at a high temperature. As illustrated in FIGS. 6 and 7, the IGBT has a relatively low on-state resistance increase rate against a temperature increase. However, the MOSFET has a high on-state resistance increase rate. For this reason, when the MOSFET is employed, it is necessary to reduce a switching loss in the MOSFET and suppress temperature increase.

For this purpose, according to the present embodiment, as illustrated in FIG. 5, the subsidiary semiconductor device 3b is turned on after the main semiconductor device 3a (IGBT) is turned on. In addition, the main semiconductor device 3a is turned off after the subsidiary semiconductor device 3b is turned off. That is, the main semiconductor device 3a is necessarily in a turned on state when the subsidiary semiconductor device (MOSFET) is switched. As a result, it is possible to switch the subsidiary semiconductor device 3b while the main semiconductor device 3a is turned on, and a voltage V applied to the subsidiary semiconductor device 3b is lowered. Therefore, while a switching loss P is generated in the main semiconductor device 3a, no switching loss P is generated in the subsidiary semiconductor device 3b in most cases. For this reason, it is possible to suppress temperature increase of the subsidiary semiconductor device 3b.

Next, a structure of the semiconductor module 2 will be described in more details. As illustrated in FIG. 1, the semiconductor module 2 according to the present embodiment includes a main body 21 including the semiconductor device 3, a power terminal 22 protruding from the main body 21, and a control terminal 20. The power terminal 22 includes a positive terminal 22p and a negative terminal 22N electrically connected to the DC power source 8 (refer to FIG. 8), and an AC terminal $22_o$ electrically connected to an AC load 81. The control terminal 20 is connected to the control circuit unit 4.

The control terminal 20 includes a main reference terminal $20_E$ connected to a reference electrode (emitter) of the main semiconductor device 3a, a main gate terminal $20_{Ga}$ connected to the gate electrode of the main semiconductor device 3a, a subsidiary reference terminal $20_S$ connected to the reference electrode (source) of the subsidiary semiconductor device 3b, and a subsidiary gate terminal $20_{Gb}$ connected to the gate electrode of the subsidiary semiconductor device 3b. The main reference terminal $20_E$ and the subsidiary reference terminal $20_S$ are formed so as to be adjacent to each other.

Figure 2:
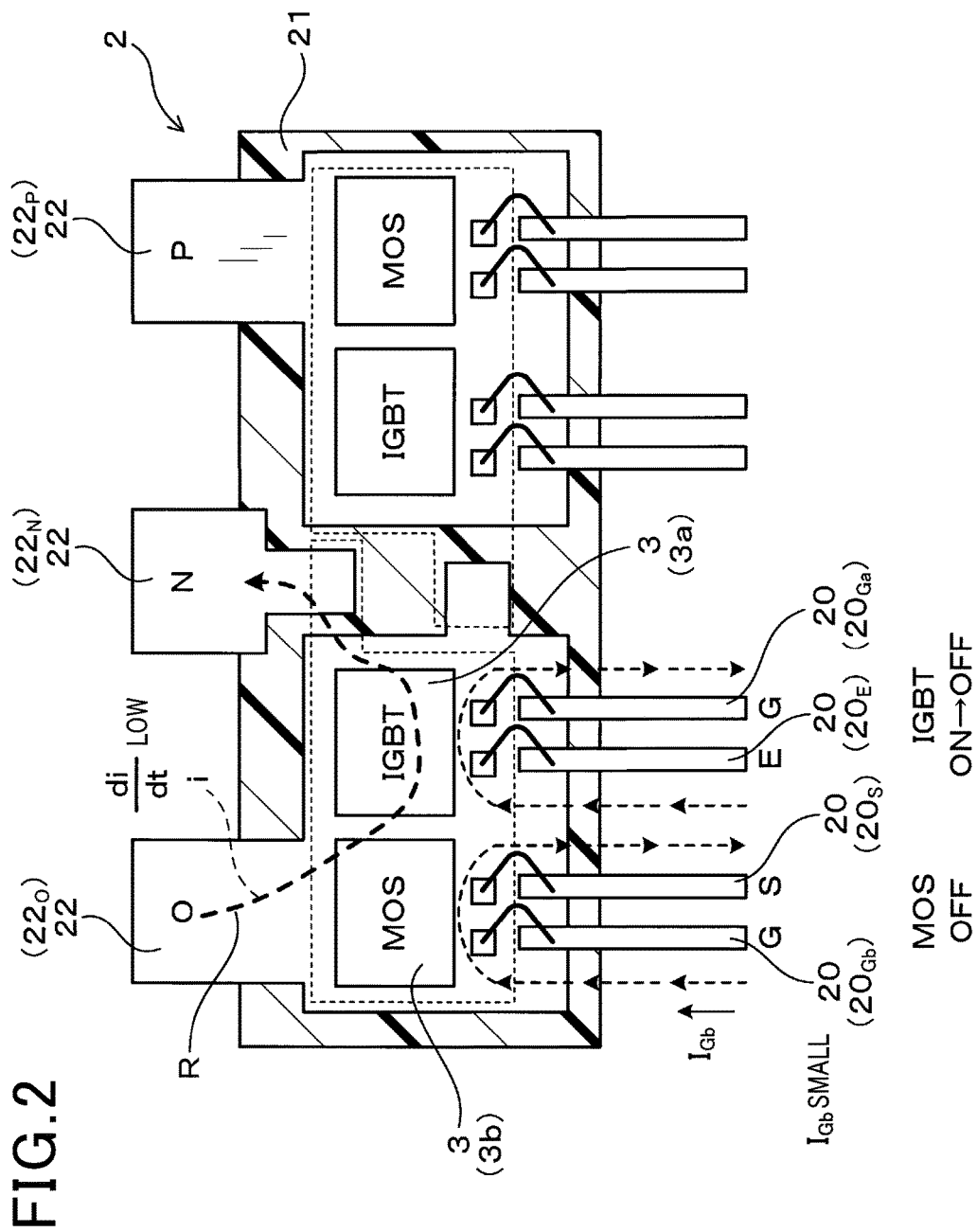
FIG. 2 is a cross-sectional view illustrating the semiconductor module according to the first embodiment when the main semiconductor device is turned off.

The control circuit unit 4 applies a voltage to the main gate terminal $20_{Ga}$ with respect to the main reference terminal $20_E$. As a result, the main semiconductor device 3a is turned on. If a voltage is applied to the main gate terminal $20_{Ga}$, a gate capacitance is charged. For this reason, as soon as the main semiconductor device 3a is turned on, a gate current (control current $I_C$) flows from the control circuit unit 4 to the main gate terminal $20_{Ga}$. In addition, as illustrated in FIG. 2, the control circuit unit 4 stops the voltage application to the main gate terminal $20_{Ga}$ when the main semiconductor device 3a is turned off. In this case, electric charges accumulated in the gate capacitance are discharged, so that an electric current flows to the main gate terminal $20_{Ga}$.

As described above, according to the present embodiment, high-speed switching is performed when the main semiconductor device 3a is turned on (refer to FIG. 5). When the main semiconductor device 3a is turned on, the control circuit unit 4 applies a voltage to the gate within a short time. As a result, the switching speed at the turn-on timing increases. In addition, when the main semiconductor device 3a is turned off, the control circuit unit 4 gradually lowers the voltage applied to the gate. As a result, the switching speed at the turn-off timing is reduced.

Figure 3:
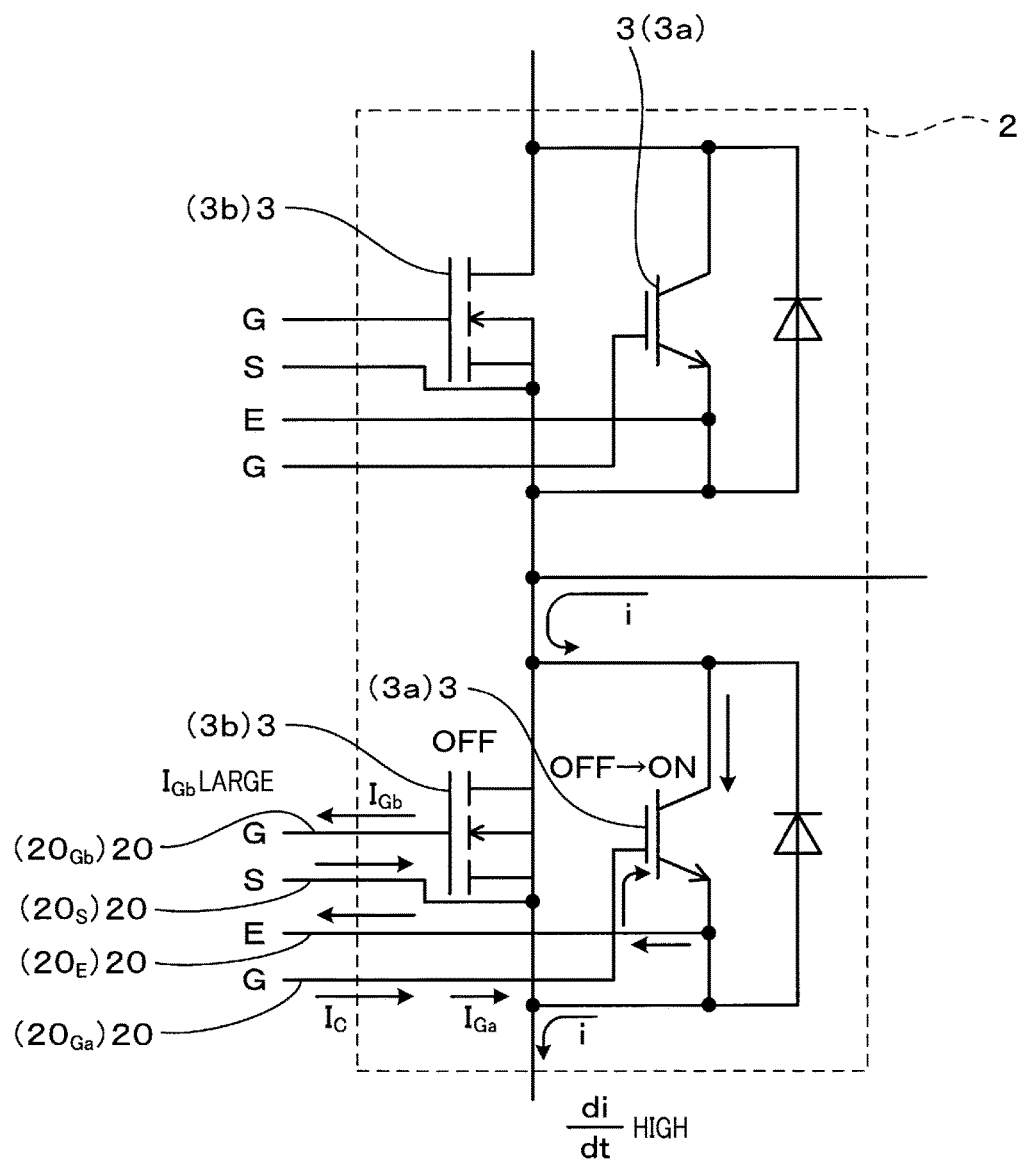

As illustrated in FIGS. 1 and 3, if the main semiconductor device 3a is switched from the off-state to the on-state, a main current i starts to flow between the collector and the emitter of the main semiconductor device 3a (IGBT). That is, the main current i is changed with time. Accordingly, a magnetic field H generated around the main current i is changed with time, so that the amount of the magnetic flux φ crossing between the control terminals $20_{Gb}$ and $20_S$ of the subsidiary semiconductor device 3b is changed with time. For this reason, an induction current $I_{Gb}$ is generated in the control terminals $20_{Gb}$ and the $20_S$.

As described above, according to this embodiment, the switching speed is set to be fast when the main semiconductor device 3a is switched from an off-state to an on-state (at the turn-on timing). For this reason, a temporal change rate di/dt of the main current i increases, and a high induction current $I_{Gb}$ is easily generated in the control terminals $20_{Gb}$ and $20_S$ of the subsidiary semiconductor device 3b. However, the semiconductor module 2 according to the present embodiment is configured such that the induction current $I_{Gb}$ flows to turn off the subsidiary semiconductor device 3b in this case. For this reason, even when a high induction current $I_{Gb}$ flows, the subsidiary semiconductor device 3b is not turned on. Therefore, the subsidiary semiconductor device 3b is turned simultaneously with the main semiconductor device 3a, so that it is possible to suppress increase of the switching loss of the subsidiary semiconductor device 3b.

Figure 4:
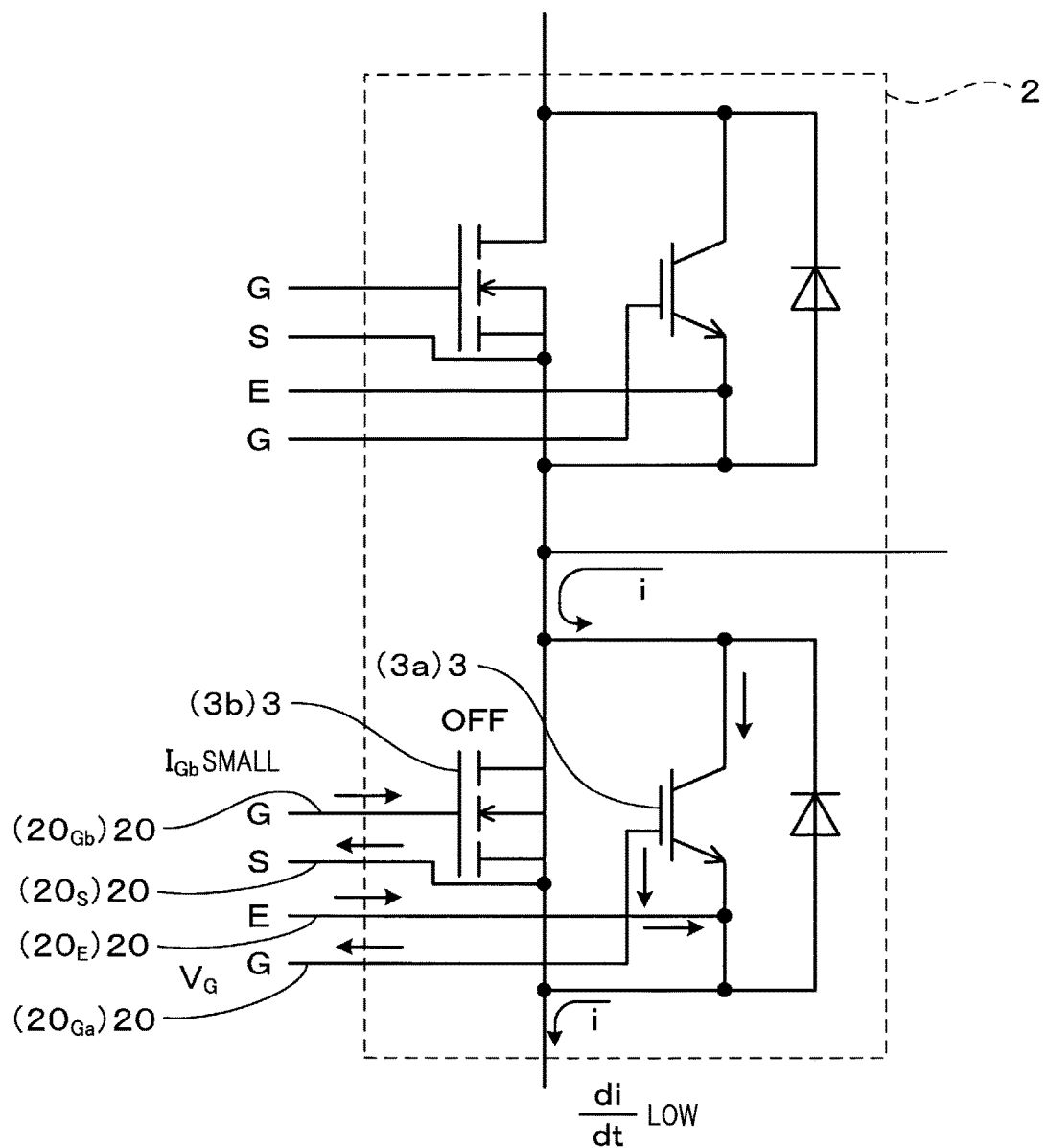
FIG. 4 is a circuit diagram illustrating the semiconductor module according to the first embodiment when the main semiconductor device is turned off.

As illustrated in FIGS. 2 and 4, if the main semiconductor device 3a is switched from an on-state to an off-state, the main current i flowing between the collector and the emitter of the main semiconductor device 3a (IGBT) is cut off. For this reason, the main current i is changed with time. Therefore, similarly to a case where the main semiconductor device 3a is turned on, an induction current $I_{Gb}$ is generated in the control terminals $20_{Gb}$ and $20_S$ of the subsidiary semiconductor device 3b.

In this case, the induction current $I_{Gb}$ flows oppositely compared with a case where the main semiconductor device 3a is turned on (at the high-speed switching timing). That is, the induction current $I_{Gb}$ flows to turn on the subsidiary semiconductor device 3b. However, according to the present embodiment, when the main semiconductor device 3a is turned off, the switching speed of the main semiconductor device 3a is delayed (refer to FIG. 5). For this reason, it is possible to reduce the generated induction current $I_{Gb}$ and suppress the subsidiary semiconductor device 3b from turning on.

Figure 9:
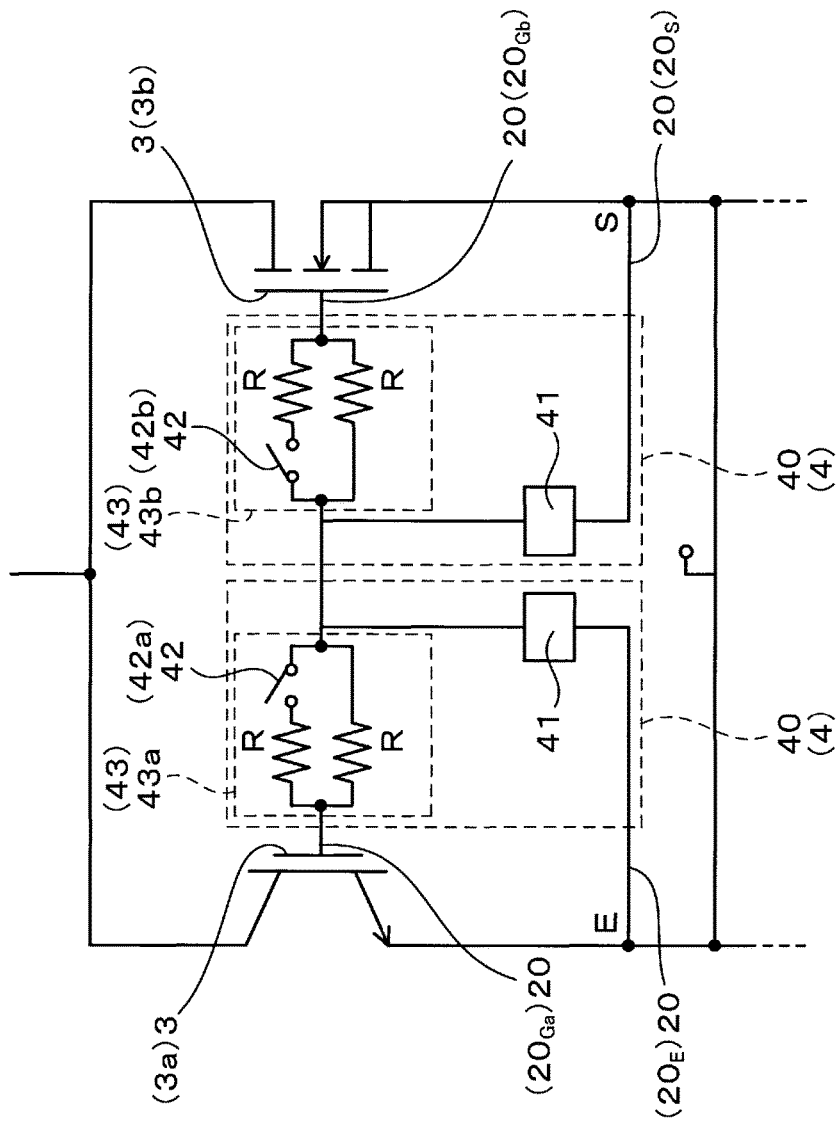
FIG. 9 is a circuit diagram illustrating a part of the semiconductor module according to the first embodiment along with a driving circuit.

Next, a driving circuit 40 for making the semiconductor devices 3a and 3b perform switching operation will be described with reference to FIG. 9. As illustrated in FIG. 9, the control terminal 20 of the semiconductor device 3 is connected to the driving circuit 40. The driving circuit 40 is formed in the control circuit unit 4 (refer to FIG. 8). The driving circuit 40 has a voltage application unit 41 that applies a voltage to the gate of the semiconductor device 3, a plurality of gate resistors R, and a switch 42. The voltage application unit 41 applies a voltage to the gate with reference to a reference electrode (emitter or source) of the semiconductor device 3.

Two gate resistors R are interposed between the semiconductor devices 3a and 3b and the voltage application unit 41. The two gate resistors R are connected in parallel to each other to form a variable resistor 43 (43a and 43b). When the semiconductor devices 3a and 3b are turned on, the main switch 42a is turned on, and the subsidiary switch 42b is turned off. As a result, a voltage is applied to the gate of the semiconductor devices 3a and 3b while a resistance value of the main variable resistor 43a is small. Accordingly, since the resistance value of the main variable resistor 43a is small, the main semiconductor device 3a is rapidly turned on.

When the semiconductor devices 3a and 3b are turned off, the main switch 42a is turned off, and the subsidiary switch 42b is turned on. As a result, voltage application to the gate of the semiconductor devices 3a and 3b stops while the resistance value of the main variable resistor 43a is large. Accordingly, since the resistance value of the main variable resistor 43a is high, the switching speed is lowered compared with a case where the semiconductor devices 3a and 3b are turned on.

Next, functional effects of the present embodiment will be described. As illustrated in FIG. 5, the control circuit unit 4 according to the present embodiment performs control such that, out of two switching timings $t_{on}$ and $t_{off}$, one of the switching timings ($t_{on}$ in FIG. 5) has a switching speed faster than that of the other of the switching timings ($t_{off}$ in FIG. 5). As illustrated in FIG. 1, the semiconductor module 2 is configured such that, at the high-speed switching timing $t_f$, an induction current $I_{Gb}$ directed to turn off the subsidiary semiconductor device 3b is generated in the control terminals $20_S$ and $20_{Gb}$ of the subsidiary semiconductor device $3b$ due to the temporal change di/dt of the main current i.

For this reason, at the high-speed switching timing $t_f$, that is, when the temporal change rate di/dt of the main current i is high, and a large induction current $I_{Gb}$ is generated in the control terminals $20_S$ and $20_{Gb}$ of the subsidiary semiconductor device $3b$, it is possible to allow this induction current $I_{Gb}$ to flow to turn off the subsidiary semiconductor device $3b$. Therefore, it is possible to suppress the subsidiary semiconductor device $3b$ from being erroneously turned on.

If the aforementioned configuration is employed, as illustrated in FIG. 2, the induction current $I_{Gb}$ flows to the control terminals $20_S$ and $20_{Gb}$ of the subsidiary semiconductor device $3b$ to turn on the subsidiary semiconductor device $3b$ at the switching timing having a relatively slow switching speed (low-speed switching timing $t_s$, refer to FIG. 5). However, since the temporal change rate di/dt of the main current i is low at the low-speed switching timing $t_s$, the induction current $I_{Gb}$ generated in the control terminals $20_S$ and $20_G$ of the subsidiary semiconductor device $3b$ is small. For this reason, at the low-speed switching timing $t_s$, the subsidiary semiconductor device $3b$ is not easily erroneously turned on by the induction current $I_{Gb}$.

As illustrated in FIG. 1, as the main semiconductor device $3a$ is turned on, the main current i flowing to the main semiconductor device $3a$ is changed with time. Accordingly, the magnetic field H generated around the main current i is changed with time. For this reason, the magnetic flux $\phi$ crossing between the control terminals $20_{Ga}$ and $20_E$ of the main semiconductor device $3a$ is changed with time, and the induction current $I_{Ga}$ is generated in the control terminals $20_{Ga}$ and $20_E$. This induction current $I_{Ga}$ flows in the same direction as that of the control current $I_C$ flowing from the control circuit unit 4 (refer to FIG. 8).

For this reason, it is possible to making the main semiconductor device $3a$ perform switching operation more rapidly. Therefore, it is possible to more reduce a switching loss of the main semiconductor device $3a$.

The main semiconductor device $3a$ according to the present embodiment is an IGBT, and the subsidiary semiconductor device $3b$ is a MOSFET.

As illustrated in FIG. 6, the MOSFET has a small on-state resistance in the low current region, and the IGBT has a small on-state resistance in the high current region. For this reason, by combining the IGBT and the MOSFET, it is possible to reduce the on-state resistance of the semiconductor module 2 across a wide current range.

The MOSFET according to the embodiment is formed of a wide bandgap semiconductor.

The MOSFET formed of a wide bandgap semiconductor has a particularly low on-state resistance. For this reason, by using this MOSFET, it is possible to particularly reduce the on-state resistance of the semiconductor module 2.

According to this embodiment, as illustrated in FIG. 1, the subsidiary reference terminal $20_S$ and the main reference terminal $20_E$ are provided so as to be adjacent to each other.

For this reason, it is possible to make such reference terminals $20_S$ and $20_E$ close to each other and reduce a parasitic inductance between the reference terminals $20_S$ and $20_E$. For this reason, such voltages, that is, the electric potential of the reference electrode (emitter) of the main semiconductor device $3a$ and the electric potential of the reference electrode (source) of the subsidiary semiconductor device $3b$ can be approximately equal to each other. Therefore, it is possible to suppress the difference between voltages applied to gates of a pair of semiconductor devices $3a$ and $3b$ or suppress the voltages applied to the gates from oscillating.

As illustrated in FIG. 9, according to the present embodiment, the main semiconductor device $3a$ and the subsidiary semiconductor device $3b$ are driven by the same driving circuit 40.

For this reason, it is possible to reduce the number of the driving circuits 40 and lower a manufacturing cost of the power conversion apparatus 1.

As described above, according to the present embodiment, it is possible to provide a power conversion apparatus capable of suppressing an erroneous operation of the subsidiary semiconductor device.

Figure 10:
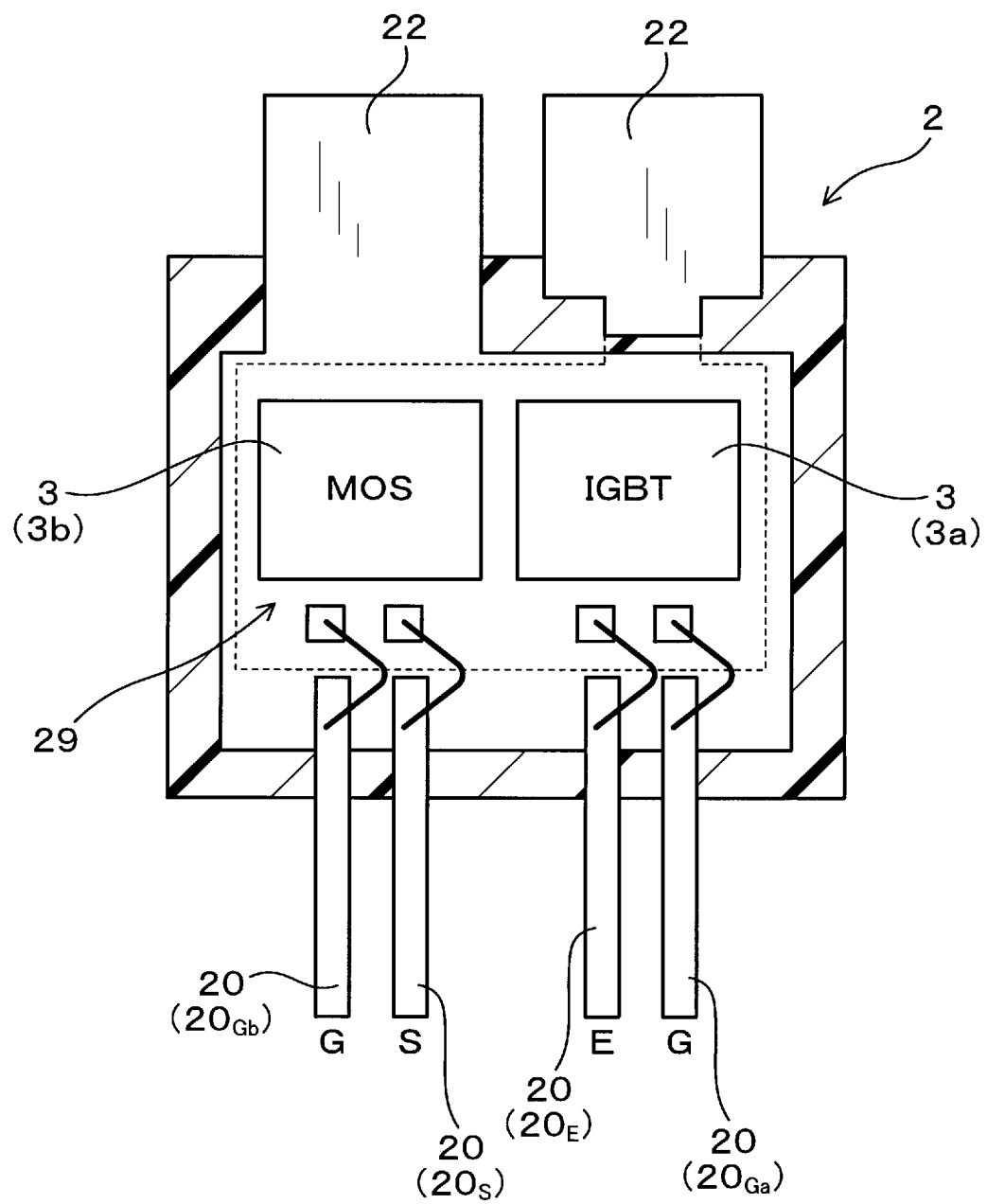
FIG. 10 is a cross-sectional view illustrating a semiconductor module provided with only one main semiconductor device and only one subsidiary semiconductor device according to the first embodiment.

Note that, according to the present embodiment, as illustrated in FIGS. 1 and 8, a single semiconductor module 2 has two semiconductor device pairs 29 each including the main semiconductor device $3a$ and the subsidiary semiconductor device $3b$. However, the present invention is not limited thereto. That is, as illustrated in FIG. 10, only one semiconductor device pair 29 may also be provided in a single semiconductor module 2.

According to this embodiment, a MOSFET formed of SiC is employed as the subsidiary semiconductor device $3b$. However, the present invention is not limited thereto. For example, a high electron mobility transistor formed of GaN may also be employed. In addition, a transistor formed of diamond may also be employed. A super-junction MOSFET may also be employed.

In the following embodiments, the same reference numerals as those used in the first embodiment denote similar elements in the first embodiment throughout the drawings unless specified otherwise.

Second Embodiment

Figure 13:
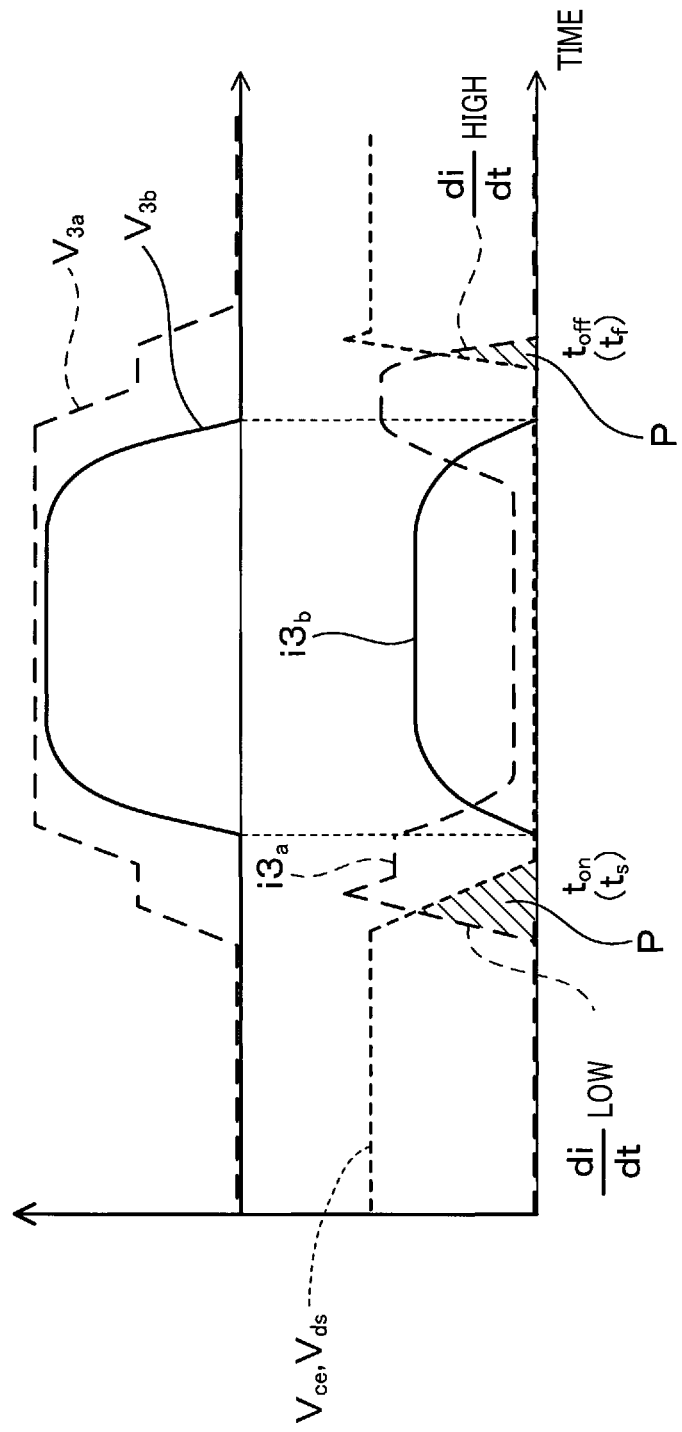
FIG. 13 is a waveform diagram illustrating a main semiconductor device and a subsidiary semiconductor device according to the second embodiment.
Figure 14:
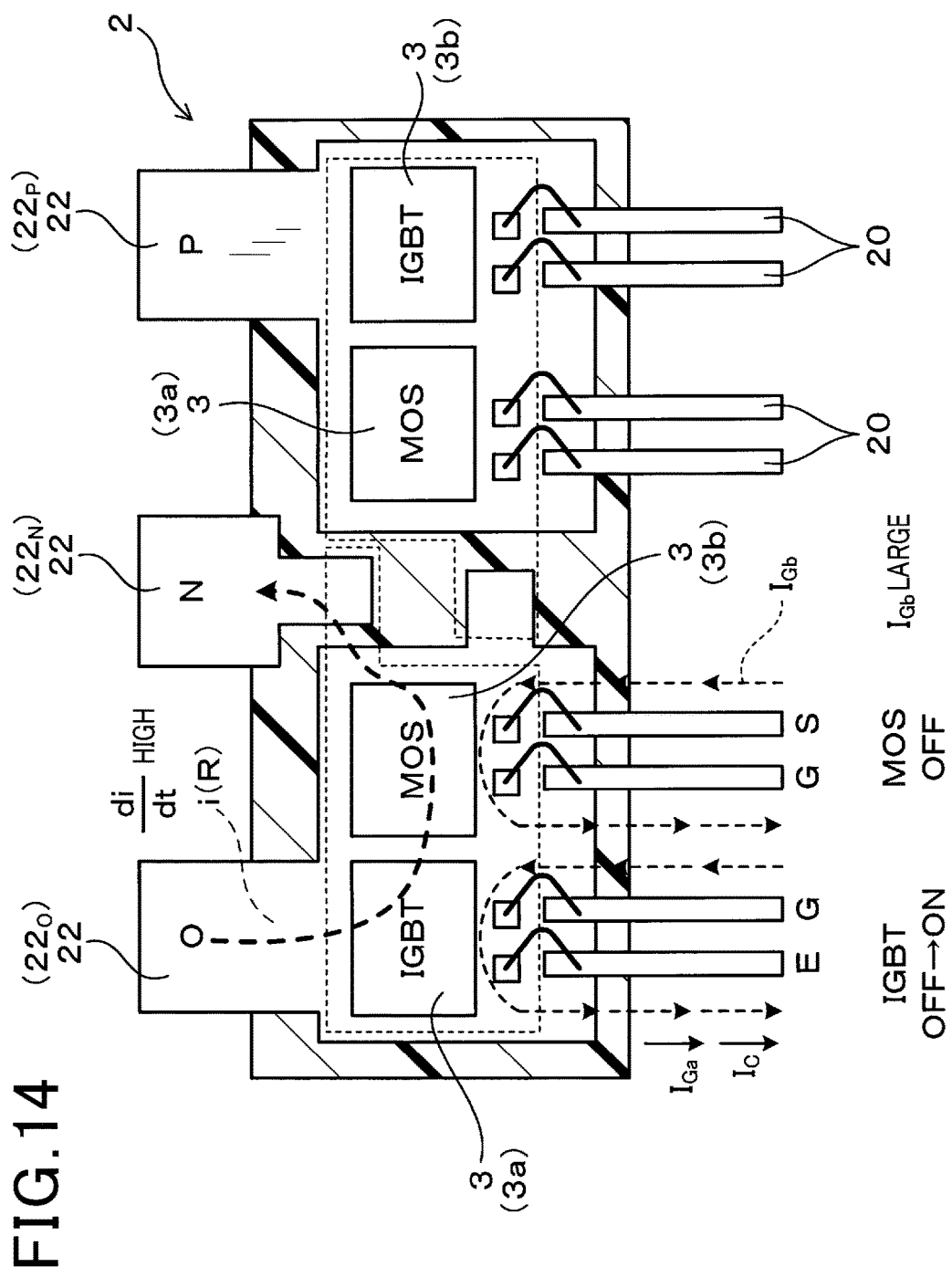

The present embodiment is an example in which a magnitude relationship of the switching speed is changed. As illustrated in FIG. 13, according to the present embodiment, a switching speed is decreased when the main semiconductor device $3a$ is turned on. Meanwhile, the switching speed is increased when the main semiconductor device $3a$ is turned off. That is, the turn-on timing is set as the low-speed switching timing $t_s$, and the turn-off timing is set as the high-speed switching timing $t_f$.

Figure 11:
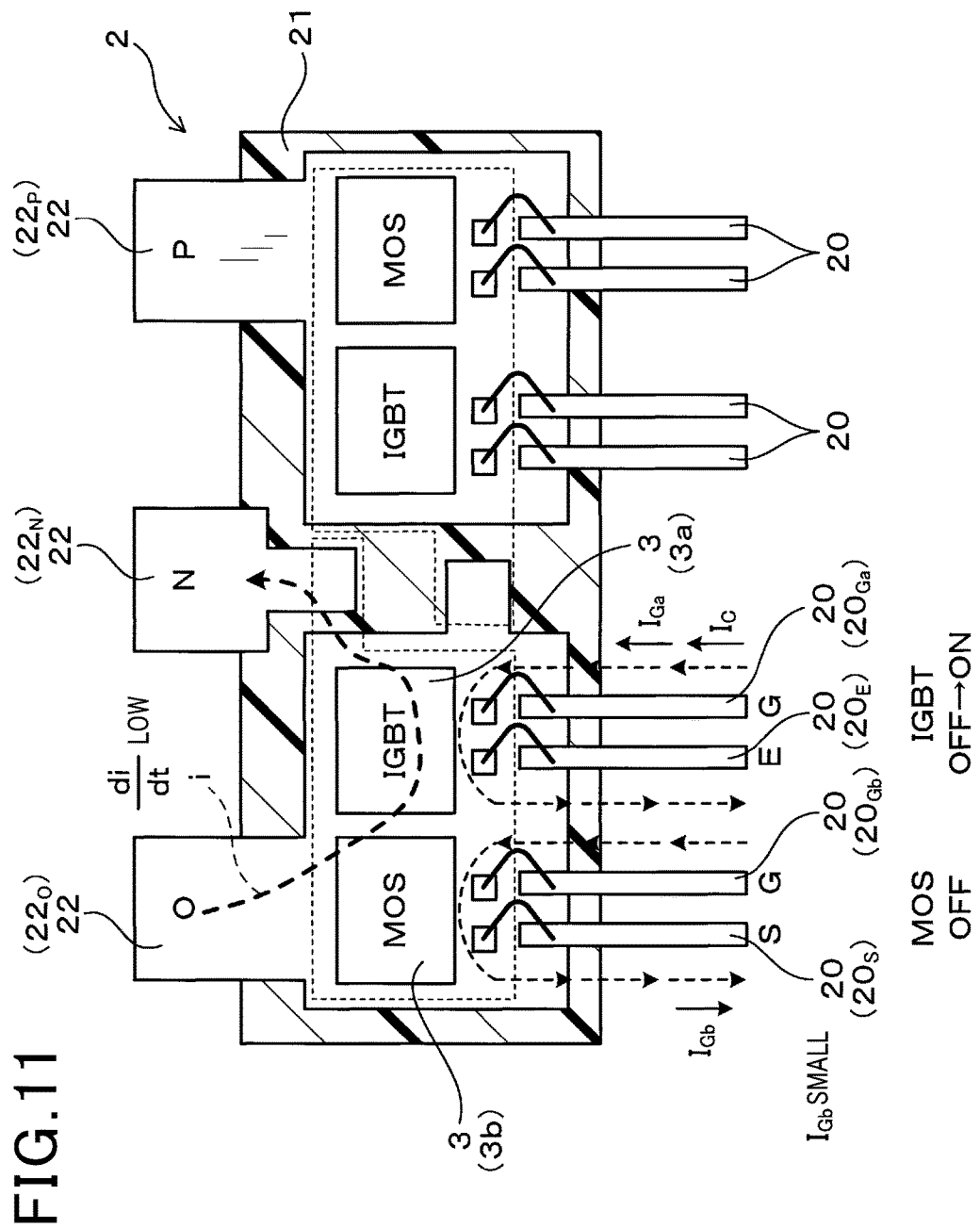

As illustrated in FIG. 11, when the main semiconductor device $3a$ is turned on, the main current i flowing through the main semiconductor $3a$ is changed with time. Therefore, an induction current $I_{Gb}$ is generated in the control terminals $20_S$ and $20_{Gb}$ of the subsidiary semiconductor device $3b$. In the semiconductor module 2 according to the present embodiment, a positional relationship between the subsidiary gate terminal $20_{Gb}$ and the subsidiary reference terminal $20_S$ is reversed compared with that of the first embodiment (refer to FIG. 1). For this reason, when the main semiconductor device $3a$ is turned on, the induction current $I_{Gb}$ flows to turn on the subsidiary semiconductor device $3b$. However, as described above, according to the present embodiment, the switching speed is decreased when the main semiconductor device $3a$ is turned on. Therefore, the generated induction current $I_{Gb}$ is small. For this reason, even when the induction current $I_{Gb}$ flows, the subsidiary semiconductor device $3b$ is not turned on.

Figure 12:
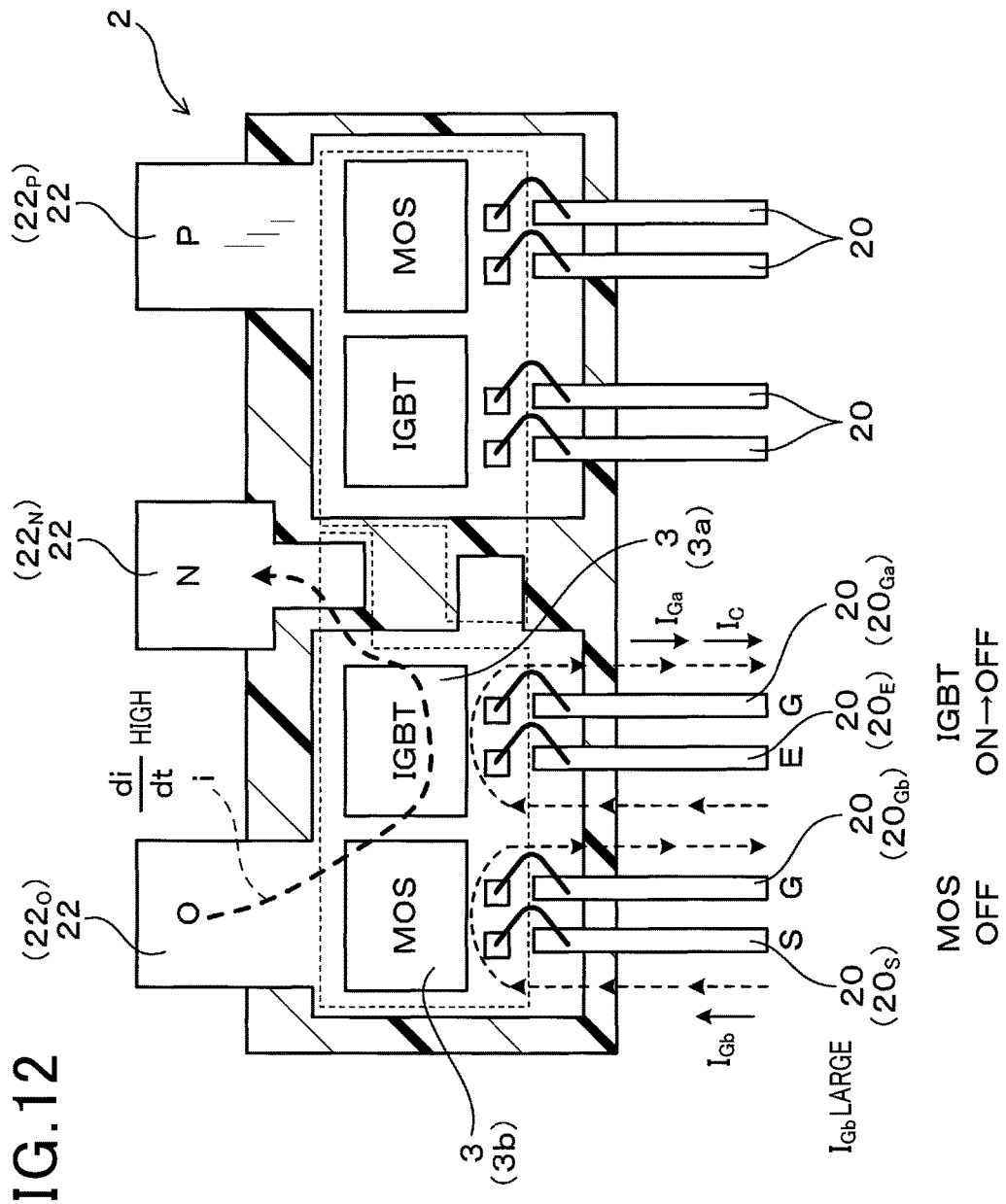
FIG. 12 is a cross-sectional view illustrating the semiconductor module according to the second embodiment when the main semiconductor device is turned off.

As illustrated in FIG. 12, when the subsidiary semiconductor device $3b$ is turned off, the induction current $I_{Gb}$ flows to the control terminals $20_S$ and $20_{Gb}$ of the subsidiary semiconductor device $3b$ to turn off the subsidiary semiconductor device 3b. When the subsidiary semiconductor device 3b is turned off, the switching speed is fast, and the high induction current $I_{Gb}$ flows accordingly. However, since the induction current $I_{Gb}$ flows to turn off the subsidiary semiconductor device 3b, the subsidiary semiconductor device 3b is not turned on.

Similarly to the first embodiment, according to the present embodiment, the power conversion apparatus 1 (refer to FIG. 8) includes a plurality of semiconductor modules 2. According to the present embodiment, a short-circuit protection circuit is formed in the control circuit unit 4. In the short-circuit protection circuit, when the semiconductor device 3a or 3b included in any one of a semiconductor device pair $29_H$ of an upper arm and a semiconductor device pair $29_L$ of a lower arm is short-circuited, the semiconductor device 3a or 3b of the opposite arm is forcibly turned off. In this case, when the main semiconductor device 3a is turned off, the switching speed at the time of the turn-off increases. Therefore, a high induction current $I_{Gb}$ flows to the control terminals $20_S$ and $20_{Gb}$ of the subsidiary semiconductor device 3b. However, as described above, this induction current $I_{Gb}$ flows to turn off the subsidiary semiconductor device 3b. Therefore, it is possible to prevent the subsidiary semiconductor device 3b from being erroneously turned on by the induction current $I_{Gb}$ when the main semiconductor device 3a is forcibly turned off. For this reason, it is possible to reliably protect the semiconductor device 3 from a short circuit.

The present embodiment includes other configurations and functional effects similar to those of the first embodiment.

Third Embodiment

The present embodiment is an example in which the structure of the semiconductor module 2 is modified. As illustrated in FIG. 2, according to the present embodiment, the subsidiary semiconductor device 3b is arranged on a path R through which the main current i of the main semiconductor device 3a flows when seen in the thickness direction of the subsidiary semiconductor device 3b.

For this reason, it is possible to allow the control terminals $20_S$ and $20_{Gb}$ of the subsidiary semiconductor device 3b to be close to the main current i. Therefore, when switching operation of the main semiconductor device 3a is performed at a high speed, it is possible to generate the high induction current $I_{Gb}$ in the control terminals $20_S$ and $20_{Gb}$ to turn off the subsidiary semiconductor device 3b. For this reason, it is possible to reliably suppress erroneous operation of the subsidiary semiconductor device 3b.

The present embodiment includes other configurations and functional effects similar to those of the first embodiment.

Fourth Embodiment

Figure 15:
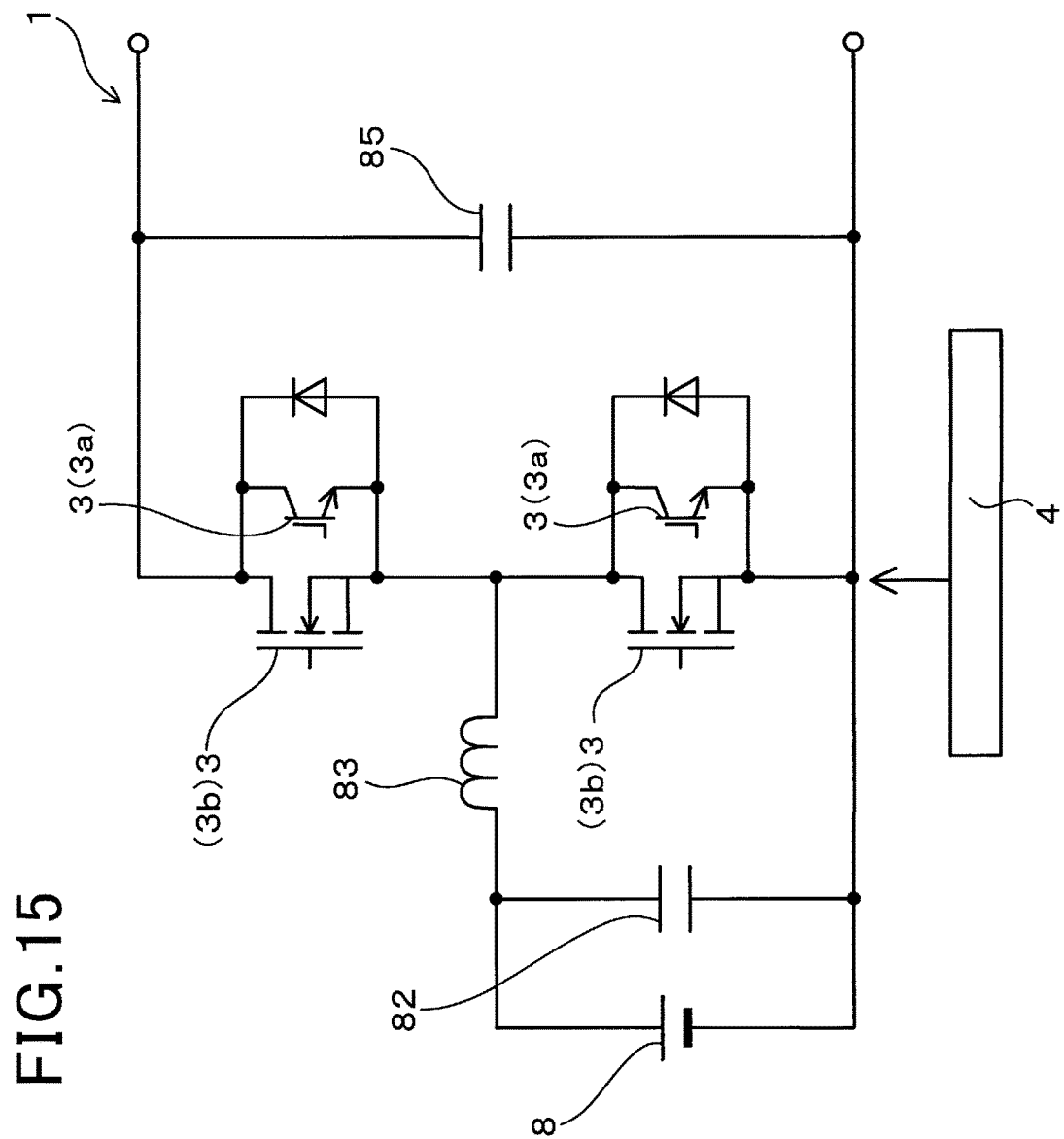
FIG. 15 is a circuit diagram illustrating a power conversion apparatus according to a fourth embodiment.

The present embodiment is an example in which the circuit configuration of the power converter 1 is modified. As illustrated in FIG. 15, according to the present embodiment, a DC-DC converter for boosting DC voltage of the DC power source 8 is provided using the main semiconductor device 3a and the subsidiary semiconductor device 3b.

The present embodiment includes other configurations and functional effects similar to those of the first embodiment.

Fifth Embodiment

Figure 16:
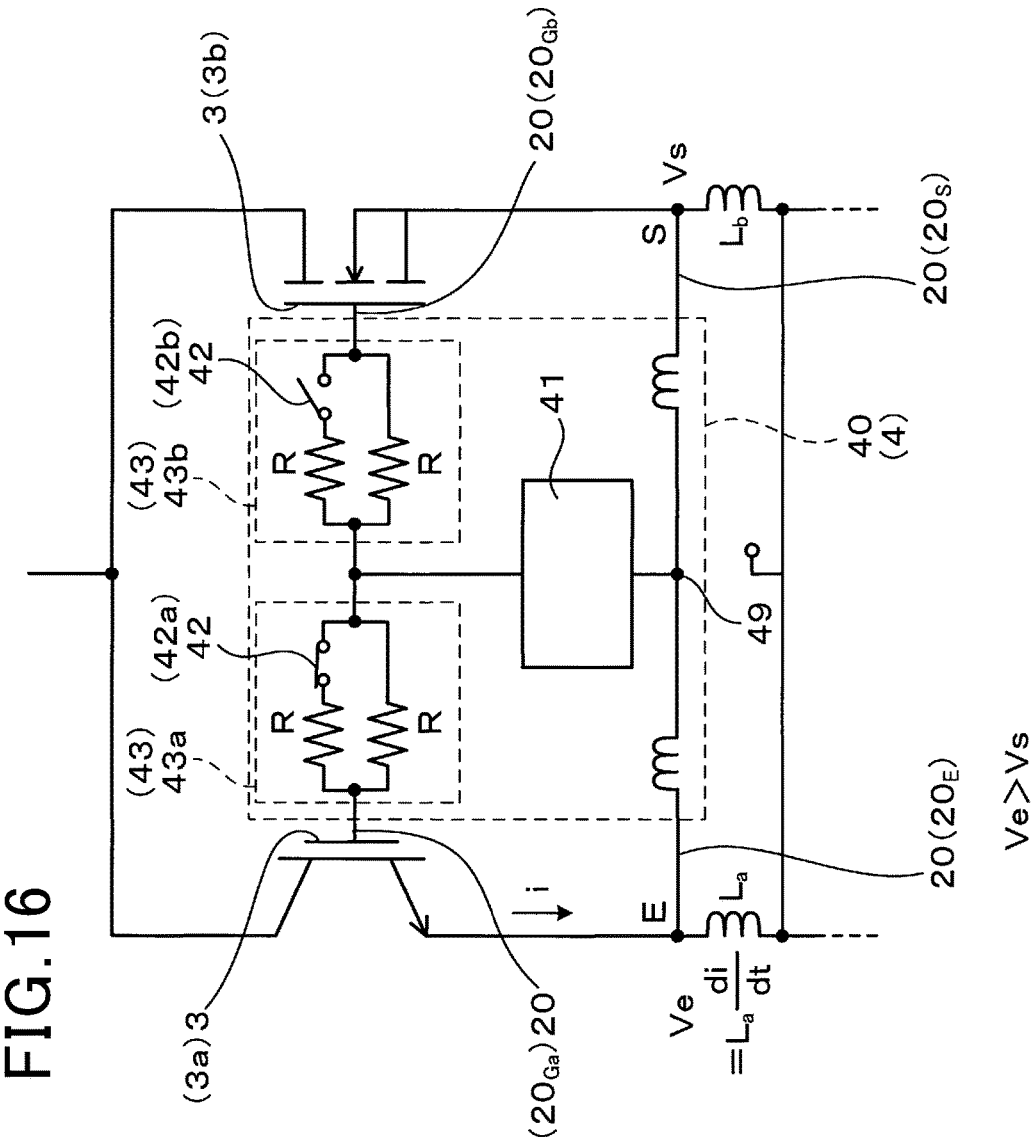

The present embodiment is an example in which the configuration of the driving circuit 40 is modified. As illustrated in FIG. 16, the power converter 1 according to the present embodiment is configured such that the main semiconductor device 3a and the subsidiary semiconductor device 3b connected in parallel to each other are driven by the same driving circuit 40. The driving circuit 40 includes a voltage application unit 41 that applies voltages to gates of the semiconductor devices 3a and 3b, a plurality of gate resistors R, and a switch 42. The voltage application unit 41 applies a voltage to the gate with reference to a midpoint 49 between the emitter of the main semiconductor device 3a and the source of the subsidiary semiconductor device 3b.

Two gate resistors R are interposed between each of the semiconductor devices 3a and 3b and the voltage application unit 41. The two gate resistors R are connected in parallel to each other to form a variable resistor 43 (43a and 43b). When the semiconductor devices 3a and 3b are turned on, the main switch 42a is turned on, and the subsidiary switch 42b is turned off as illustrated in FIG. 16. As a result, voltages are applied to the gates of the semiconductor devices 3a and 3b while the resistance value of the main variable resistor 43a is decreased, and the resistance value of the subsidiary variable resistor 43b is increased. Accordingly, since the resistance value of the main variable resistor 43a is small, the main semiconductor device 3a is rapidly turned on, and the switching speed increases. In addition, since the subsidiary variable resistor 43b has a high resistance value, it is turned on later than the main semiconductor device 3a.

Figure 17:
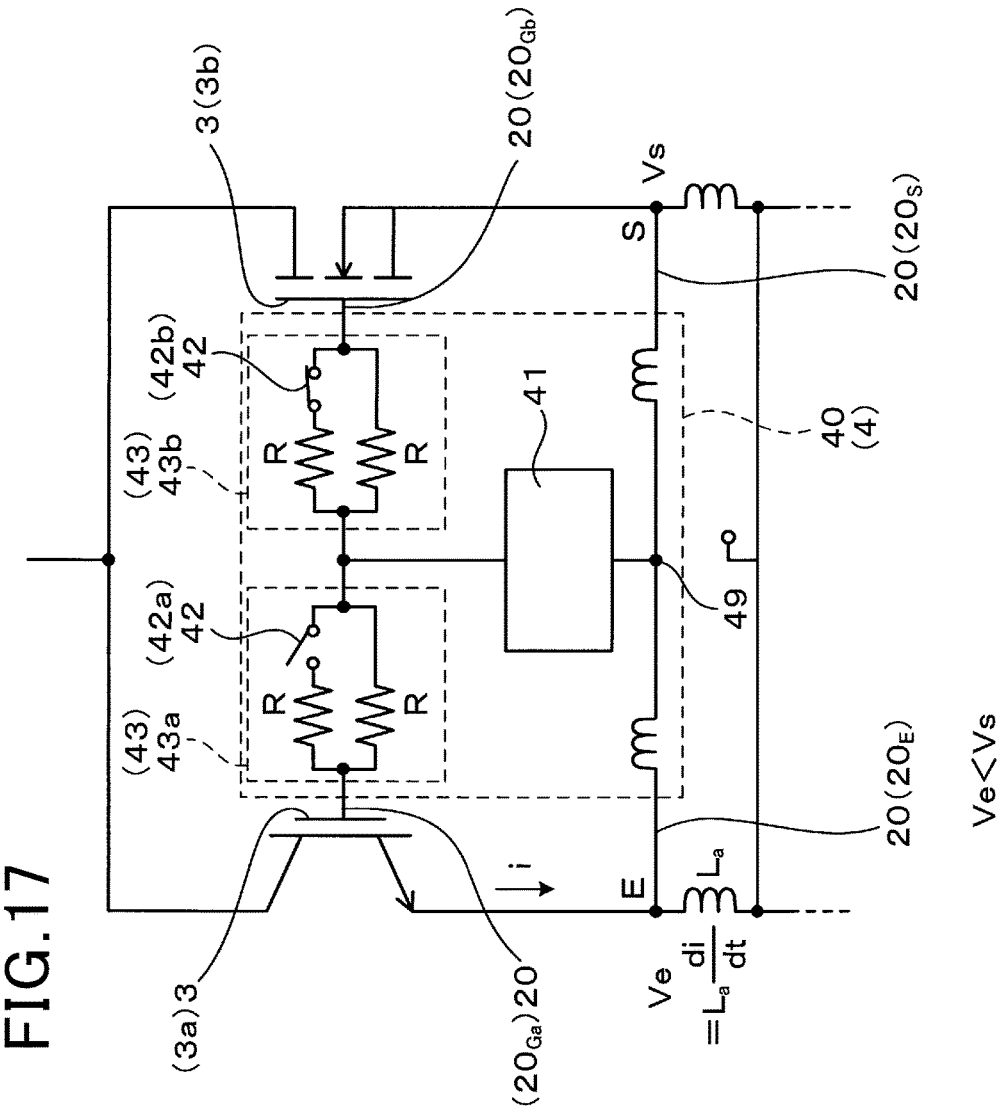
FIG. 17 is a circuit diagram illustrating a part of the semiconductor module according to the fifth embodiment along with the driving circuit when the main semiconductor device is turned off.

When the semiconductor devices 3a and 3b are turned off, the main switch 42a is turned off, and the subsidiary switch 42b is turned on as illustrated in FIG. 17. As a result, the voltage application to the gates of the semiconductor devices 3a and 3b stops in the state where the resistance value of the main variable resistor 43a is increased, and the resistance value of the subsidiary variable resistor 43b decreased. Accordingly, since the subsidiary variable resistor 43b has a low resistance value, the subsidiary semiconductor device 3b is rapidly turned off. Since the main variable resistor 43a has a high resistance value, it is turned off later than the subsidiary semiconductor device 3b. In addition, the switching speed decreases compared with a case where it is turned on.

Functional effects of the present embodiment will be described. In the power conversion apparatus 1 according to the present embodiment, the main semiconductor device 3a and the subsidiary semiconductor device 3b connected in parallel to each other are driven by the same driving circuit 40. For this reason, it is possible to reduce the number of the driving circuits 40. Therefore, it is possible to reduce the manufacturing cost of the power conversion apparatus 1.

As illustrated in FIG. 16, the voltage application unit 41 applies a voltage to the gate with reference to the midpoint 49 between the emitter of the main semiconductor device 3a and the source of the subsidiary semiconductor device 3b. In addition, there is a parasitic inductance $L_a$ in the emitter of the main semiconductor device 3a. For this reason, the inductance $L_a$ generates an inductive voltage ($L_a di/dt$) when the main semiconductor device 3a is turned on, and an electric current i flows. In this case, since the subsidiary semiconductor device 3b is not in an on-state, no inductive voltage ($L_b di/dt$) is generated in the source of the subsidiary semiconductor device 3b. Therefore, when the main semiconductor device 3a is turned on, the emitter potential Ve becomes higher than the source potential $V_s$. For this reason, the voltage application unit 41 applies a voltage to the subsidiary semiconductor device 3b with reference to the midpoint 49 where the electric potential is higher than the source potential Vs. Therefore, a high voltage is easily applied between the source and the gate of the subsidiary semiconductor device 3b.

However, according to the present embodiment, when the main semiconductor device 3a is turned on, an induction current flows to the control terminal 20 of the subsidiary semiconductor device 3b to turn off the subsidiary semiconductor device 3b. Therefore, it is possible to suppress a particularly high voltage from being applied to the subsidiary semiconductor device 3b. For this reason, it is possible to suppress the subsidiary semiconductor device 3b from being erroneously operated by a particularly high voltage applied to the gate of the subsidiary semiconductor device 3b.

Since the temporal change rate di/dt has a negative sign when the main semiconductor device 3a is turned off (refer to FIG. 17), the emitter potential Ve becomes lower than the source potential Vs. Accordingly, the voltage application unit 41 applies a voltage to the gate of the subsidiary semiconductor device 3b with reference to the midpoint 49 where the electric potential is lower than the source potential Vs. For this reason, it becomes difficult to apply a sufficient voltage between the gate and the source of the subsidiary semiconductor device 3b. According to the present embodiment, when the main semiconductor device 3a is turned off, an induction current flows to the control terminal 20 of the subsidiary semiconductor device 3b to turn on the subsidiary semiconductor device 3b. However, in this case, it is difficult to apply a voltage to the gate of the subsidiary semiconductor device 3b. Therefore, it is possible to reliably prevent the subsidiary semiconductor device 3b from being erroneously turned on.

The present embodiment includes other configurations and functional effects similar to those of the first embodiment.

It will be appreciated that the present invention is not limited to the configurations described above, but any and all modifications, variations or equivalents, which may occur to those who are skilled in the art, should be considered to fall within the scope of the present invention.

Hereinafter, an aspect of the above-described embodiments will be summarized.

As an aspect of the embodiment, a power conversion apparatus (1) includes: a semiconductor module (2) including a semiconductor device (3); and a control circuit unit (4) that controls switching operation of the semiconductor module. The semiconductor module has a main semiconductor device (3a) and a subsidiary semiconductor device (3b) connected in parallel to each other as the semiconductor device. The control circuit unit performs control such that the subsidiary semiconductor device is turned on after the main semiconductor device is turned on, and the main semiconductor device is turned off after the subsidiary semiconductor device is turned off. The control circuit unit performs control such that, out of two switching timings including a turn-on timing at which the main semiconductor device is switched from an off-state to an on-state and a turn-off timing at which the main semiconductor device is switched from an on-state to an off-state, one of the switching timings has a switching speed faster than that of the other of the switching timings. The semiconductor module is configured such that, at a high-speed switching timing having a fast switching speed, an induction current ($I_{Gb}$) directed to turn off the subsidiary semiconductor device is generated in a control terminal (20) of the subsidiary semiconductor device depending on a temporal change (di/dt) of a main current (i) flowing to the main semiconductor device.

The control circuit unit of the power conversion apparatus performs control such that, one of the two switching timings has a switching speed faster than that of the other of the switching timings. In addition, the semiconductor module is configured such that, at the high-speed switching timing, an induction current directed to turn off the subsidiary semiconductor device is generated in the control terminal of the subsidiary semiconductor device depending on a temporal change of the main current.

For this reason, at the high-speed switching timing, that is, when a temporal change rate of the main current is high, and a large induction current is generated in the control terminal of the subsidiary semiconductor device, this induction current can flow to turn off the subsidiary semiconductor device. Therefore, it is possible to suppress the subsidiary semiconductor device from being erroneously turned on.

If the aforementioned configuration is employed, an induction current directed to turn on the subsidiary semiconductor device flows to the control terminal of the subsidiary semiconductor device at the other switching timing (low-speed switching timing). However, since the temporal change rate of the main current is low at the low-speed switching timing, the induction current generated in the control terminal of the subsidiary semiconductor device is small. For this reason, the subsidiary semiconductor device is not easily erroneously turned on by the induction current at the low-speed switching timing.

As described above, according to this aspect, it is possible to provide a power converter capable of suppressing an erroneous operation of the subsidiary semiconductor device.

What is claimed is:

1. A power conversion apparatus comprising:
   a semiconductor module including a semiconductor device that is a main semiconductor device and a subsidiary semiconductor device connected in parallel to each other, the semiconductor module being configured such that, at a high-speed switching timing, a first induction current directed to turn off the subsidiary semiconductor device is generated in a control terminal of the subsidiary semiconductor device depending on a temporal change of a main current flowing to the main semiconductor device; and
   a control circuit unit that controls switching operation of the semiconductor module, the control circuit unit performing control such that:
   the subsidiary semiconductor device is turned on after the main semiconductor device is turned on, and the main semiconductor device is turned off after the subsidiary semiconductor device is turned off;
   out of two switching timings including a turn-on timing at which the main semiconductor device is switched from an off-state to an on-state and a turn-off timing at which the main semiconductor device is switched from an on-state to an off-state, one of the switching timings has a switching speed faster than that of the other of the switching timings.

2. The power conversion apparatus according to claim 1, wherein the semiconductor module is configured such that, at the high-speed switching timing, a second induction current having a same direction as that of a control current flowing from the control circuit unit to the control terminal of the subsidiary semiconductor device is generated in a control terminal of the main semiconductor device depending on the temporal change of the main current flowing to the main semiconductor device.

3. The power conversion apparatus according to claim 1, wherein the main semiconductor device is an IGBT, and the subsidiary semiconductor device is a MOSFET.

4. The power conversion apparatus according to claim 3, wherein the MOSFET is formed of a wide bandgap semiconductor.

5. The power conversion apparatus according to claim 1, wherein
the semiconductor module has a main reference terminal connected to a reference electrode of the main semiconductor device as a control terminal of the main semiconductor device, and a subsidiary reference terminal connected to a reference electrode of the subsidiary semiconductor device, and
the main reference terminal and the subsidiary reference terminal are formed to be adjacent to each other.

6. The power conversion apparatus according to claim 1, wherein the subsidiary semiconductor device is arranged on a path through which the main current of the main semiconductor device flows when seen in a thickness direction of the subsidiary semiconductor device.

7. The power conversion apparatus according to claim 1, wherein
two semiconductor device pairs, each having one of the semiconductor device, are connected in series to each other,
the control circuit unit has a short-circuit protection circuit configured to turn off any one of the semiconductor device of an upper arm side and the semiconductor device of a lower arm side when the semiconductor device of the other arm side is short-circuited, and
the semiconductor module is configured such that the first induction current directed to turn off the subsidiary semiconductor device is generated in the control terminal of the subsidiary semiconductor device depending on the temporal change of the main current flowing to the main semiconductor device when the main semiconductor device is turned off.

8. The power conversion apparatus according to claim 1, wherein
the control circuit unit includes a driving circuit that drives the main semiconductor device and the subsidiary semiconductor device, and
the control circuit unit is configured such that the main semiconductor device and the subsidiary semiconductor device connected in parallel to each other are driven by using a same driving circuit.

* * * * *